(12) United States Patent
Winkler et al.

(10) Patent No.: US 7,315,029 B2
(45) Date of Patent: Jan. 1, 2008

(54) ELECTROSTATIC DEFLECTION SYSTEM WITH LOW ABERRATIONS AND VERTICAL BEAM INCIDENCE

(75) Inventors: Dieter Winkler, Munich (DE); Henry Pearce-Percy, Los Gatos, CA (US); Juergen Frosien, Reimerling (DE); William J. Devore, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 99 days.

(21) Appl. No.: 11/241,880

(22) Filed: Sep. 30, 2005

(65) Prior Publication Data

US 2007/0075262 A1   Apr. 5, 2007

(51) Int. Cl.
*G21K 1/08* (2006.01)
*H01J 3/14* (2006.01)
*H01J 3/26* (2006.01)
*H01J 49/42* (2006.01)

(52) U.S. Cl. .................. 250/396 R; 250/311; 250/397; 250/398

(58) Field of Classification Search ............. 250/396 R
See application file for complete search history.

(56) References Cited

U.S. PATENT DOCUMENTS

| | | | |
|---|---|---|---|
| 5,929,452 A | 7/1999 | Yoshitake et al. | |
| 6,509,568 B1 | 1/2003 | Ooae et al. | |
| 6,617,580 B2 * | 9/2003 | Voelkl | 250/311 |
| 6,825,476 B2 * | 11/2004 | Adamec | 250/398 |
| 6,828,573 B1 | 12/2004 | Kawano et al. | |
| 6,870,172 B1 | 3/2005 | Mankos et al. | |
| 2004/0119021 A1 | 6/2004 | Parker et al. | |
| 2005/0133733 A1 | 6/2005 | Nakasuji et al. | |

* cited by examiner

*Primary Examiner*—David A. Vanore
(74) *Attorney, Agent, or Firm*—Patterson & Sheridan, LLP

(57) ABSTRACT

Embodiments of the present invention may be utilized to improve electron beam deflection. One embodiment provides an electrostatic deflection system with electrodes that minimize aberrations and to achieve vertical incidence simultaneously. By using at least two stages of deflection for a deflection direction, the present invention allows the deflected electron beam to pass a back focal plane of an objective lens while deflection capacitors are not disposed across the back focal plane. As a result, deflection electrodes can have an angle of 120° to minimize aberrations and simultaneously achieve vertical incidence of the electron beam on a target to avoid distortions or changes in magnification with height variations of the target or focus variations.

19 Claims, 8 Drawing Sheets

ELECTROSTATIC DEFLECTION SYSTEM WITH LOW ABERRATIONS AND VERTICAL BEAM INCIDENCE

BACKGROUND OF THE INVENTION

1. Field of the Invention

Embodiments of the present invention generally relate to an electrostatic deflection system used in electron beam systems.

2. Description of the Related Art

An electron beam is a group of electrons that have approximately the same kinetic energy and move in approximately the same direction. Electron beam technologies are used in many fields, such as cathode ray tubes (CRT), lithography, scanning electron microscopes, and welding. Electron beam systems, such as scanning electron microscopes, vector and raster beam lithography systems, usually have an electron beam column configured to deflect an electron beam over a target, e.g., a mask or a wafer.

The electron beam column usually have a deflection system to deflect the electron beam over the target either by scanning it, e.g. in image creation, or by arbitrarily deflecting it, e.g. in a vector lithography system. Electron beam systems usually have an objective lens (or delivery optics) which serves to focus the deflected electron beam on the target. Electron beams are generally deflected by a magnetic or an electric field. An electrostatic deflection system is a system that uses an electric field to deflect the electron beams. Because an electric field is generally faster than an magnetic field in deflecting an electron beam, electrostatic deflection systems are usually used to implement fast deflection and to achieve high throughput in the electron beam systems.

Electron beam systems usually require vertical incidence, i.e. that the principal beam (central beam) hits the target perpendicularly so that changes in target height and small focusing do not result in distortion of the scanned or imaged area. In state-of-the-art systems, this is achieved by placing the center of gravity of the deflection system in the back focal plane of the objective lens.

FIGS. 2A and 2B illustrate a side view and a top view, respectively, of a deflection system 245 and an objective lens 250 of a state-of-the-art electron beam system. The deflection system 245 consists of a quardrupole having two crossed capacitors for deflections in x and y directions respectively. Two electrodes 246 form an x capacitor configured to deflect an electron beam 201 in the x direction. Two electrodes 247 form a y capacitor configured to deflect the electron beam in y direction. Point 241 denotes the center of gravity of both pair of electrodes 246 and 247. The objective lens 250 is disposed such that its back focal point coincides with the point 241. For each pair of electrodes 246 and 247, deflection can be considered occurring at the center of the gravity. Therefore, the deflected electron beams 201 always pass through the back focal point of the objective lens 250 and are further deflected by the objective lens 250 to be perpendicular to a target 255.

In electron beam systems, the deflection process may induce aberrations or otherwise degrade of the focused electron beam causing deterioration of resolution. Such aberrations may be minimized by choosing deflector electrodes shaped in arcs of a circle that cover approximately 120°. FIG. 3 illustrates a pair of electrodes 346 for deflecting an electron beam 301 along x direction. Each of the electrode 346 is curved as an arc of a circle. The angle θ is approximately 120°.

Unfortunately, 120 degree electrostatic deflector electrodes cannot be superimposed. The curved electrodes in FIG. 3 cannot be used in the deflection system 245 of FIGS. 2A and 2B because of geometrical limitations, in this case the wide angle of the type of aberration minimizing deflector electrodes. Therefore, the state-of-the-art electron beam systems cannot simultaneously fulfill minimizing aberration and achieving vertical incidence.

Therefore, a need exists for electrostatic deflection systems that allow minimizing aberration and achieving vertical incidence simultaneously.

SUMMARY OF THE INVENTION

Embodiments of the present invention generally relate to an electrostatic deflection system used in electron beam systems. One embodiment provides an apparatus for deflecting an electron beam. The apparatus comprises first and second deflector configured to deflect the electron beam along a first direction, wherein the first and second deflectors are disposed, respectively, above and below a back focal plane of an objective lens.

Another embodiment provides an electron beam deflection system. The electron beam deflection system comprises first and second deflectors configured to deflect an electron beam along a first direction, and delivery optics configured to deflect the electron beam to a target, wherein the delivery optics have a back focal plane, and the first and second deflectors are disposed on opposite sides of the back focal plane.

Yet another embodiment provides a method for deflecting a charged particle beam by a distance. The method comprises providing an objective lens over a target, providing first and second deflectors configured to deflect the charged particle beam to the objective lens along a first direction, wherein the first deflector is positioned above a back focal plane of the objective lens and the second deflector is positioned below the back focal plane of the objective lens, determining a first angle and a second angle according to the distance, deflecting the charged particle beam by the first deflector by the first angle, and deflecting the charged particle beam by the second deflector by the second angle.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention may be utilized to improve electron beam deflection. One embodiment provides an electrostatic deflection system with electrodes that minimize aberrations and to achieve vertical incidence simultaneously. By using at least two stages of deflection for a deflection direction, the present invention allows the deflected electron beam to pass a back focal plane of an objective lens while deflection capacitors are not disposed across the back focal plane. As a result, deflection electrodes can have an angle of 120° to minimize aberrations and simultaneously achieve vertical incidence of the electron beam on a target to avoid distortions or changes in magnification with height variations of the target or focus variations.

While embodiments of the present invention will be described with reference to an electron beam deflection system, those skilled in the art will recognize that the concepts described herein may be applied to control deflection of a variety of different types of charged particle beams used in a variety of different applications. It should be noted that a two stage deflection in one direction will be described in the present invention, those skilled in the art will recognize that the concept described herein may be applied to multistage deflection. Further, curved electrodes with 120° angle are described here, those skilled in the art will recognize that other electrodes may be accommodated with corresponding changes in capacitor design.

An Exemplary Eletron Beam Column

Figure 1:
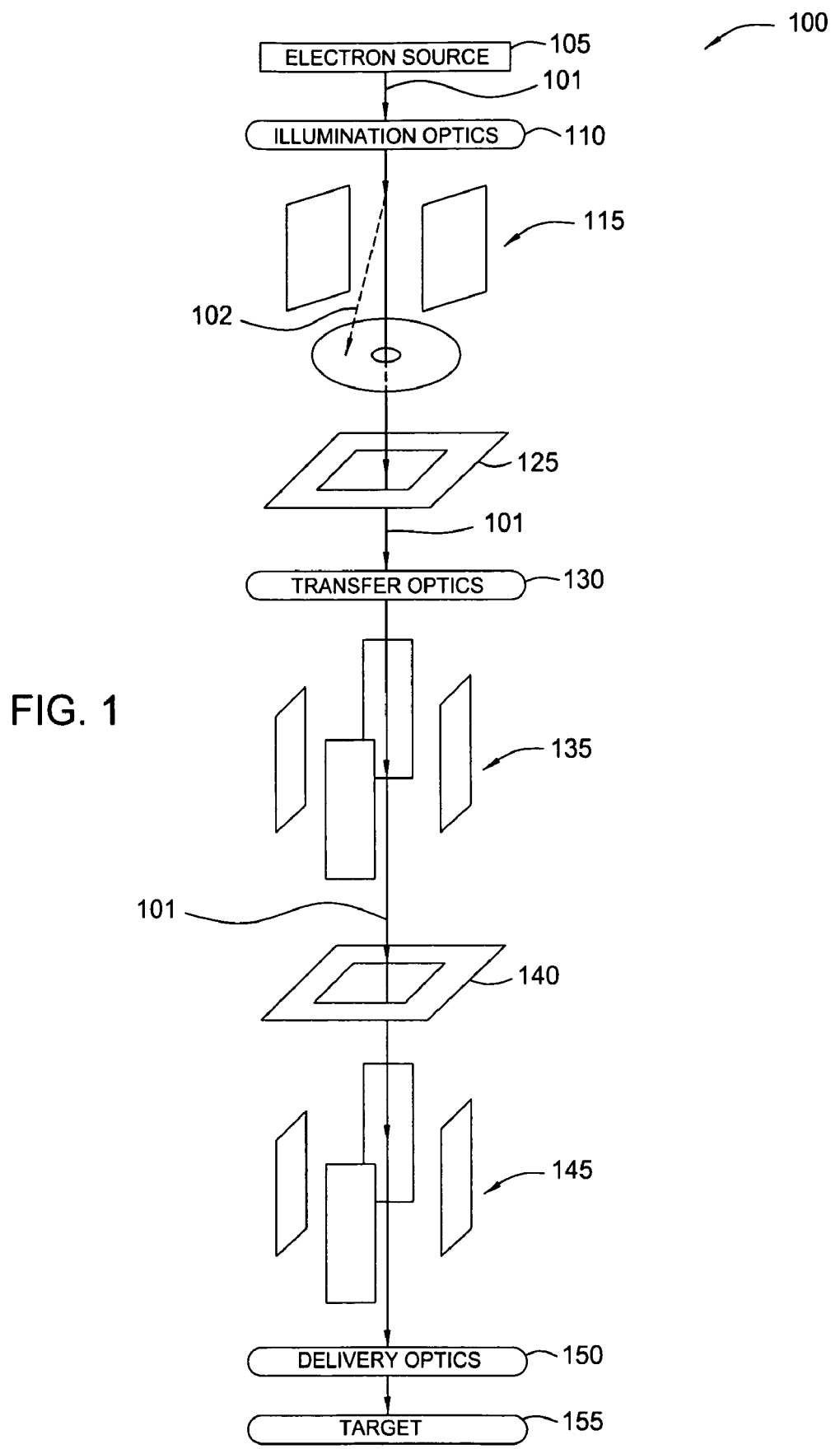
FIG. 1 is a schematic view of an electron beam column in connection with one or more embodiments of the present invention.
Figure 2A:
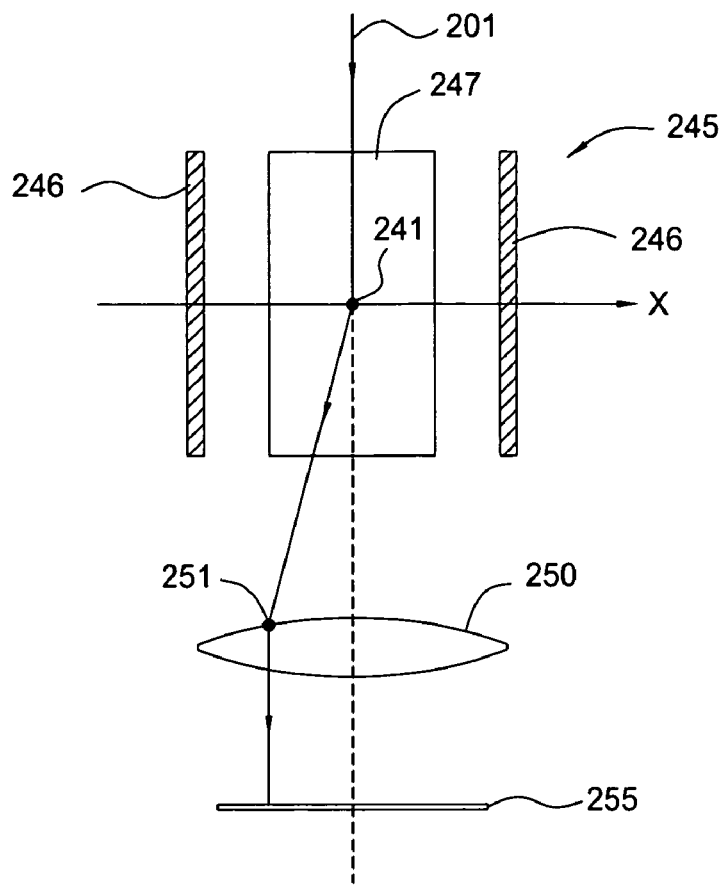
FIG. 2A is a sectional view of a state-of-the-art deflection system capable of vertical incidence.
Figure 2B:
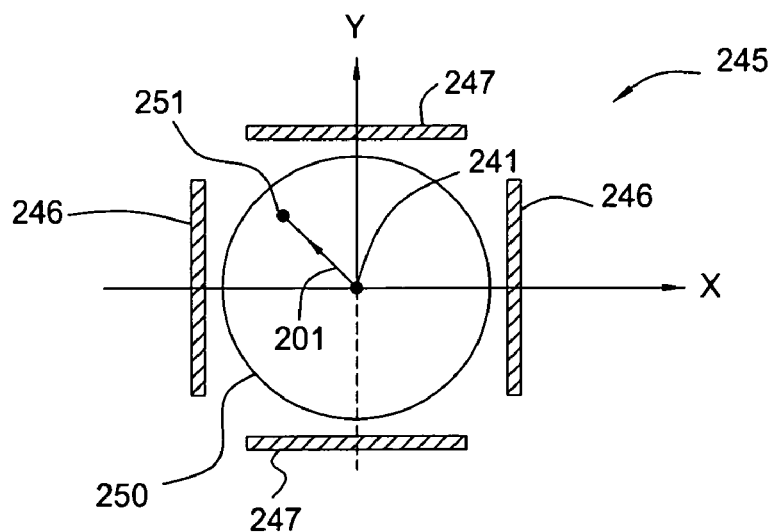
FIG. 2B is a top view of the deflection system of FIG. 2A.
Figure 3:
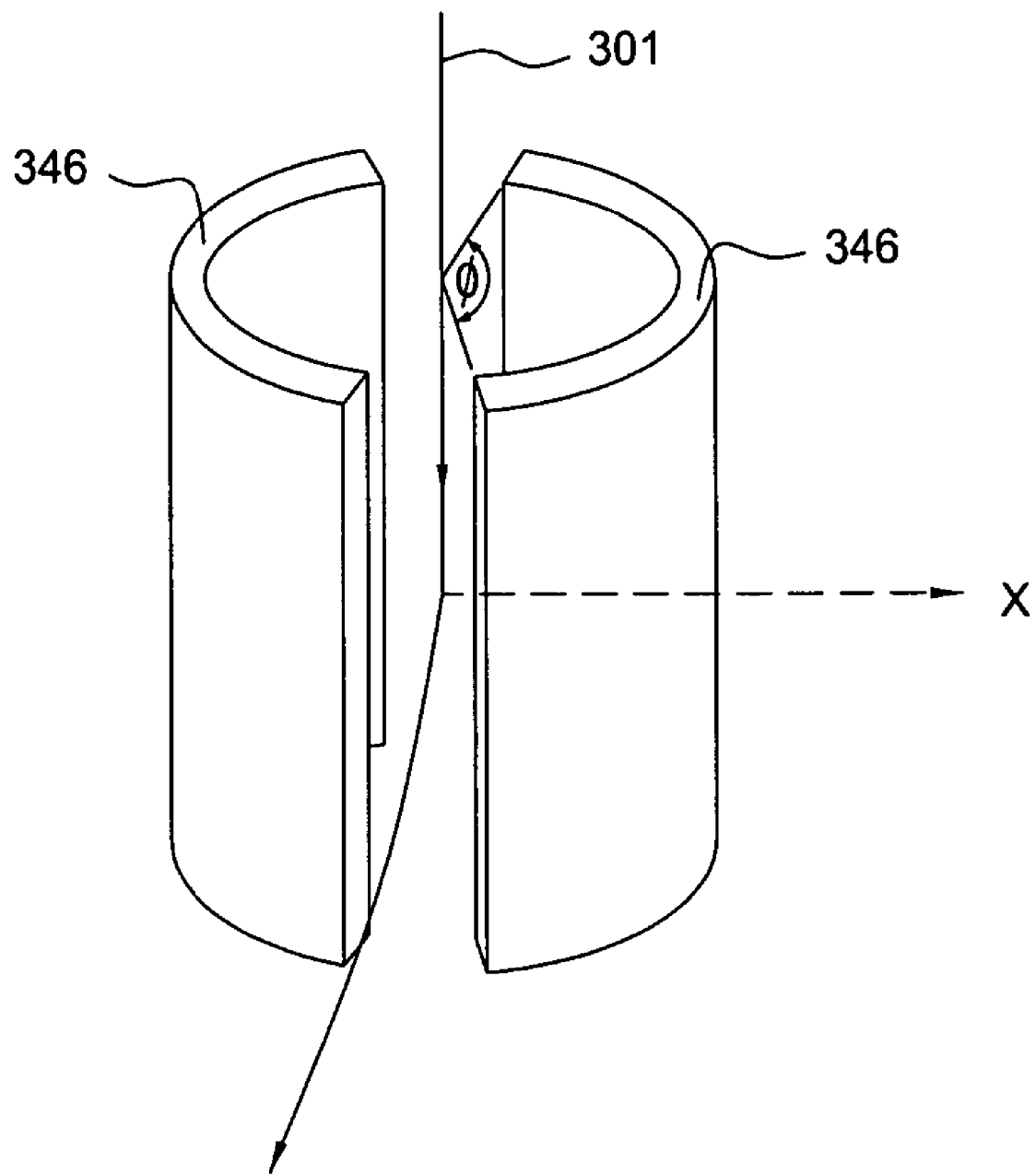
FIG. 3 is a schematic view of a pair of state-of-the-art deflector electrodes that minimizes aberration.

Electron beam systems generally have an electron beam column configured to shape electron beams and to move shaped electron beams to desired locations on a target. FIG. 1 is a schematic view of an electron beam column 100 in connection with one or more embodiments of the present invention. The electron beam column 100 includes an electron beam source 105 adapted to generate an electron beam 101, illumination optics 110, a blanking deflector 115, a blanking aperture 120, an upper aperture 125, transfer optics 130, a shape deflector 135, a lower aperture 140, a vector deflector 145 and delivery optics 150.

The electron beam source 105 may be a thermal field emission source, thermal emission source or field emission source. The illumination optics 110 are configured to assist the electron beam source 105 illuminate the upper aperture 125, while the transfer optics 130 are configured to project the electron beam 101 through the upper aperture 125 on the lower aperture 140. The delivery optics 150 are configured to project the deflected electron beam 110 to a target 155. The blanking aperture 120 is configured to prevent electron beams from reaching the upper aperture 125. The upper aperture 125 and the lower aperture 140 are configured to form the shape of the electron beam 101.

The blanking deflector 115 is configured to deflect the electron beams 101 in the onto the blanking aperture 120, e.g. along line 102, so that the electron beam 101 is prevented from reaching the target 155. The shape deflector 135 and the vector deflector 145 are configured to shape and move the electron beam 101 in response to the signals generated by a flash generator. More specifically, the shape deflector 135 is configured to move the electron beam 101 such that the overlap of the image or shadow of the upper aperture 125 with the lower aperture 140 can be modified. The electron beam 101 that passes through the lower aperture 140 has the shape of the overlap of the image of the upper aperture 125 with the lower aperture 140. In this manner, the shape deflector 135 is configured to shape the electron beam 101. The movement and shaping of the electron beam 101 is provided in more details in paragraphs 0025-0034 of U.S. patent application Ser. No. 10/996,020, filed in Nov. 22, 2004, entitled "Method for Elimination Low Frequency Error Sources to Critical Dimension Uniformity in Shaped Beam Writing Systems", which is incorporated by reference.

The vector deflector 145 is configured to move the shaped electron beam 101 to the desired location on the target 155. As discussed above, it is desirable for the vector deflector 145 to minimize aberration and to achieve vertical incidence.

Exemplary Deflection Systems

Figure 4:
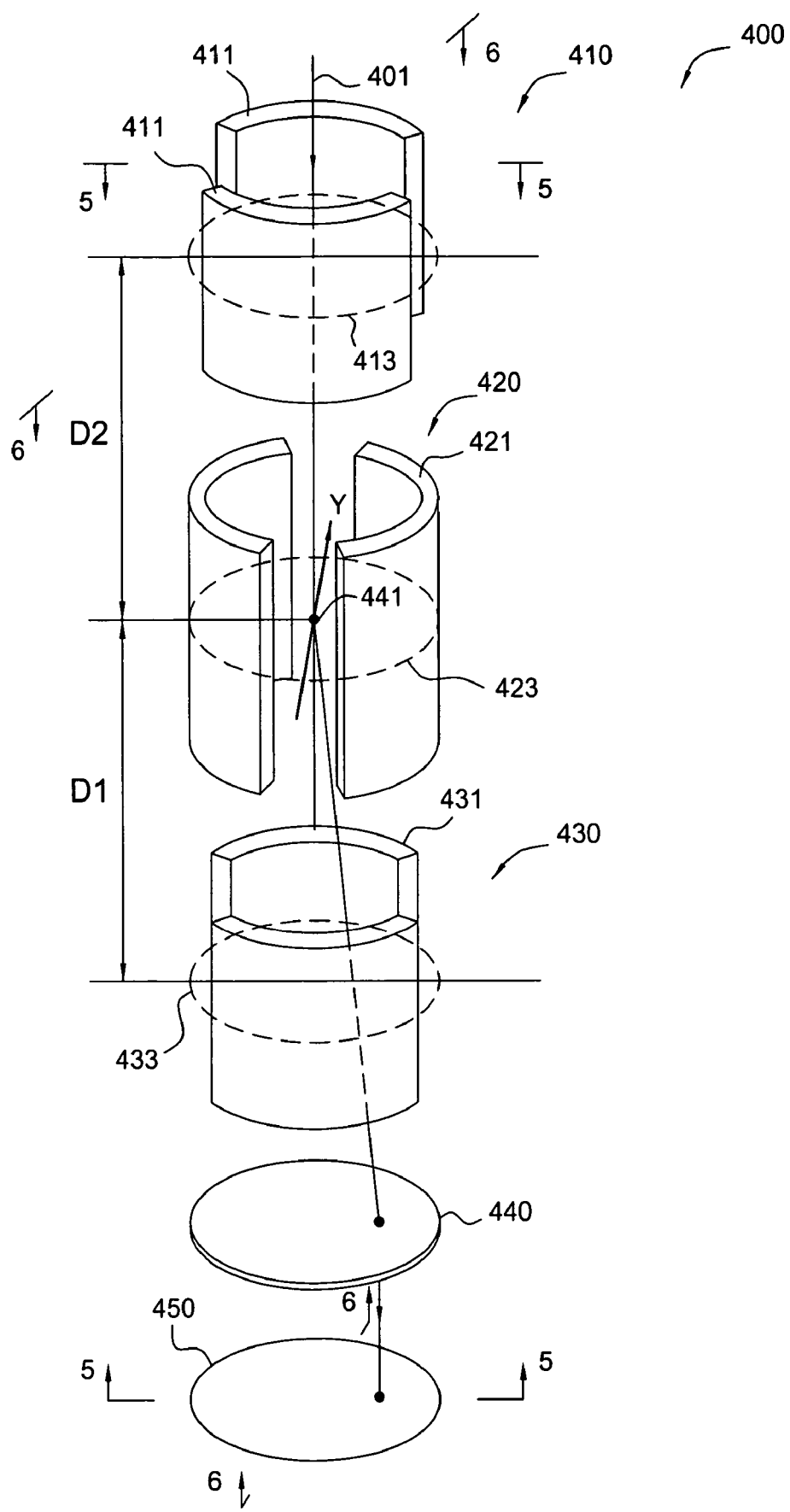
FIG. 4 is a schematic view of a deflection system of the present invention.

FIG. 4 is a schematic view of a deflection system 400 capable of vertical incidence and minimizing aberrations in accordance with one embodiment of the present invention. The deflection system 400 may be used as a vector deflector and delivery optics in electron beam columns, such as the electron beam column 100 shown in FIG. 1.

The deflection system 400 deflects an electron beam 401 in two directions, namely x and y, by three stages using three deflector capacitors 410, 420 and 430 stacked together. An objective lens 440 having a back focal point 441 is disposed between a target 450 and the deflector capacitors 410, 420 and 430. The deflector capacitors 410 and 430 are configured to deflect the electron beam 401 along y direction. The deflector capacitor 420 is configured to deflect the electron beam 401 along x direction. The deflector capacitor 410 comprises a pair of electrodes 411, each has a shape of curved arc of a circle that covers approximately 120°. Similarly, the deflector capacitor 420 comprises a pair of curved electrodes 421 and the deflector capacitor 430 comprise a pair of curved electrodes 431. Thus, all three deflector capacitors 410, 420 and 430 minimizes aberrations.

The deflector capacitor 420 is positioned such that its center of gravity coincides with the back focal point 441 of the objective lens 440 and a plane 423 which bisects the deflector capacitor 420 coincides with the back focal plane of the objective lens 440. Therefore, the deflector capacitor 420 is disposed symmetrically to the back focal plane of the objective lens 440. The deflector capacitors 410 and 430 are arranged on opposite sides of the plane 423, which is also the back focal plane of the objective lens 440. Planes 413 and 433 bisect the deflector capacitors 410 and 430, respectively. D1 and D2 represent distances between planes 413 and 423, and planes 423 and 433, respectively. In one embodiment, D1 equals D2, and the deflector capacitors 410 and 430 are of the same size. This three stage arrangement of the deflection system 400 enables vertical incidence in both x and y directions, as further shown in FIGS. 5 and 6.

The x and y directions for a given set of electrodes are usually set 90 degrees, as shown in FIG. 4. However, to compensate for the Larmor rotation of the electrons within an objective lens, for example the objective lens 440 of FIG. 4, an angle may be adapted between varies sets of electrodes.

Figure 5:
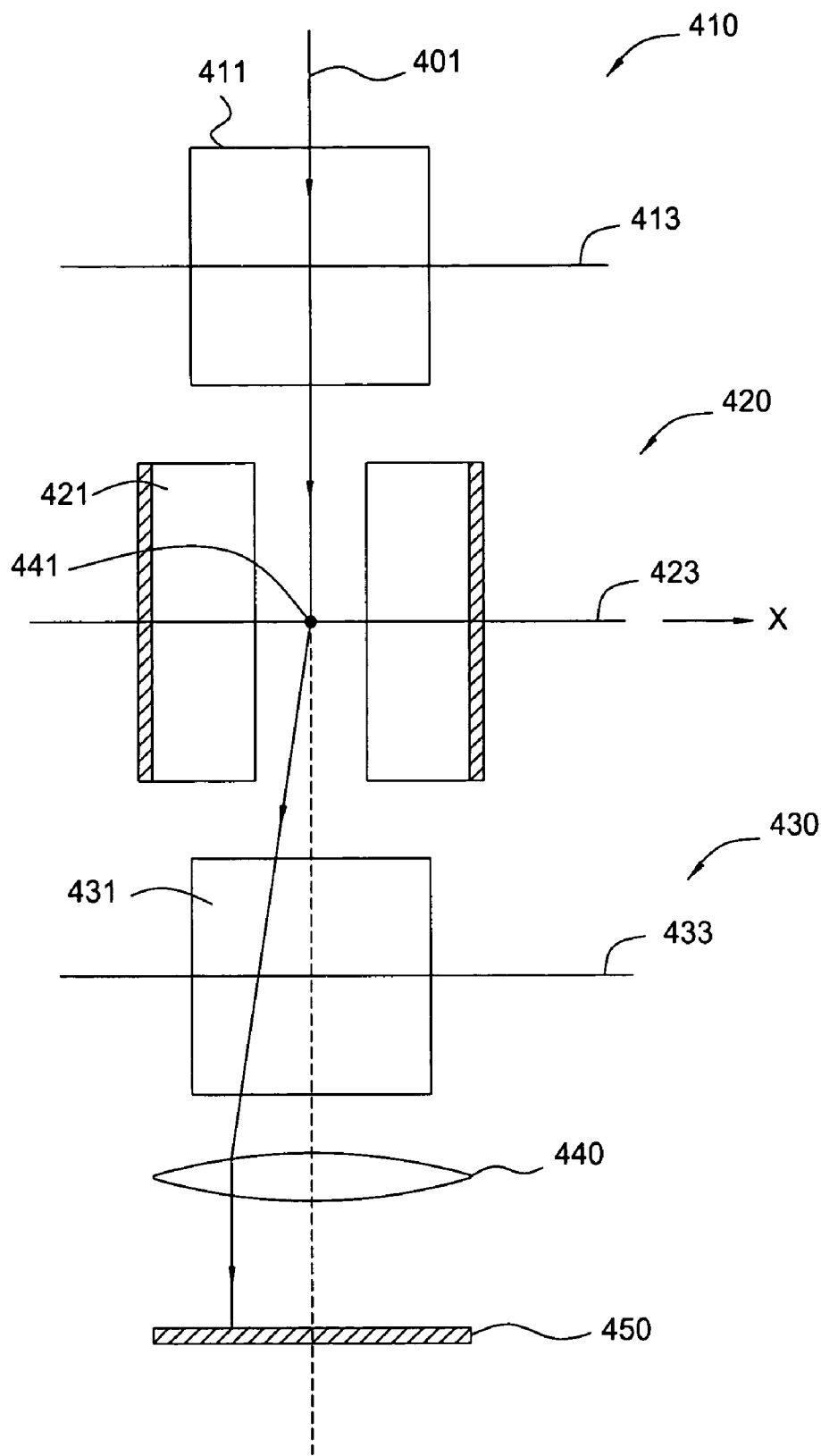
FIG. 5 is a sectional view of the deflection system of FIG. 4.

FIG. 5 is a sectional view of the deflection system 400 along section 5-5 shown in FIG. 4. FIG. 5 illustrates deflection of the electron beam 401 in the x direction. The deflector capacitors 410 and 430 do not affect the deflection in the x direction. Only the deflector capacitor 420 affects the x direction deflection. Since the center of gravity of deflector capacitor 420 with the back focal point 441 of the objective lens 440, the electron beam 401 always passes the focal point 441 from this point of view.

Figure 6:
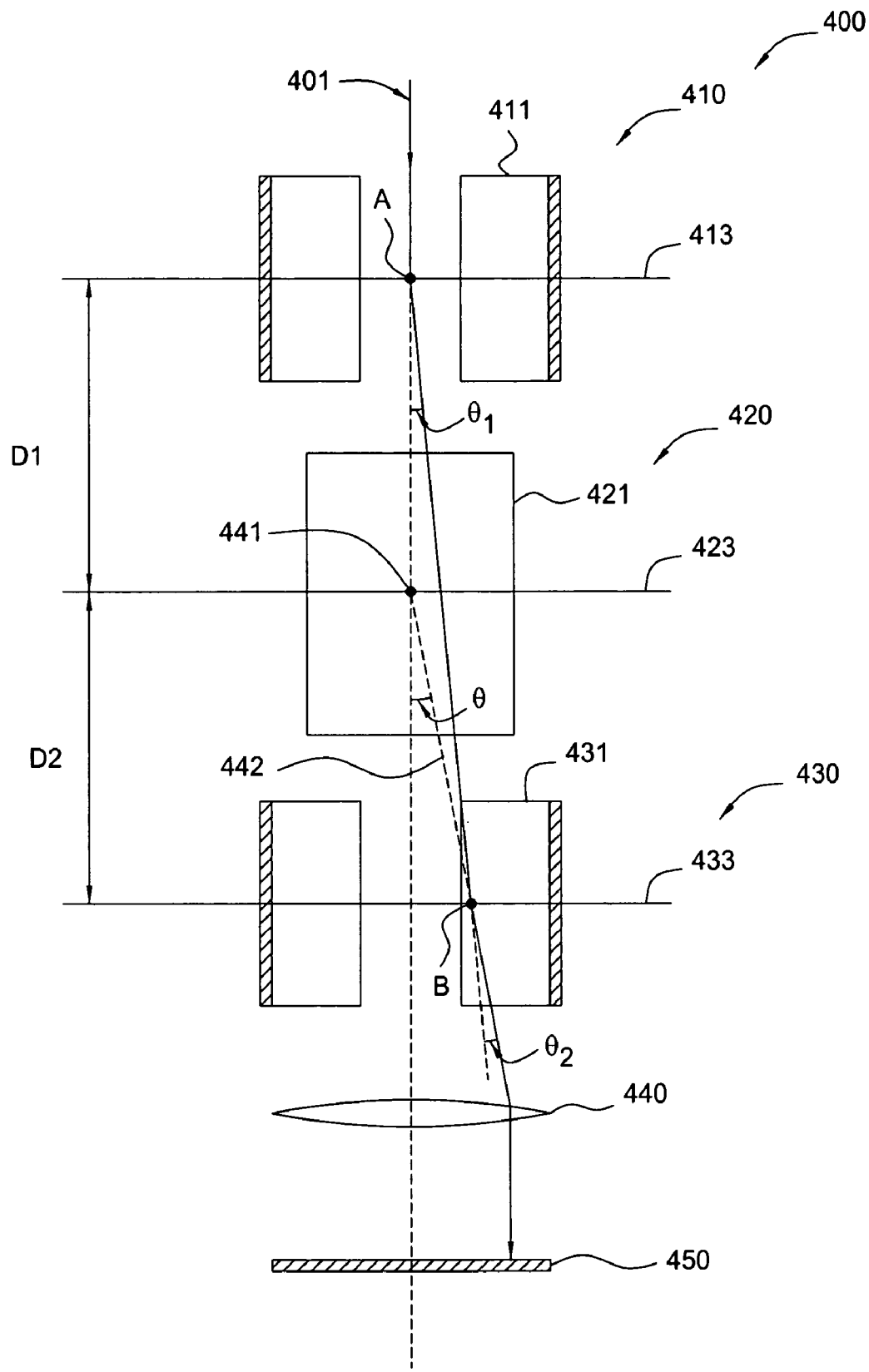
FIG. 6 is a sectional view of the deflection system of FIG. 4.

FIG. 6 is a sectional view of the deflection system 400 along section 6-6 of FIG. 4. FIG. 6 illustrates deflection of the electron beam 401 in the y direction. The electron beam 401 is deflected by two stages. To deflect the electron beam 401 for an angle of θ from the back focal point 441, the deflector capacitor 410 first deflects the electron beam 401 for an angle of $\theta_1$ at point A, then the deflector capacitor 430 deflects the electron beam 410 for an angle of $\theta_2$ at point B, where $\theta=\theta_1+\theta_2$. The angles $\theta_1$ and $\theta_2$ are decided by geometrical arrangement of the system such that the electron beam 401 acts as if it comes from the back focal point 441 when reaches the objective lens 440. For each deflection angle θ, values of the angles $\theta_1$ and $\theta_2$ may be decided by following calculations:

$$\theta_1 = \arctan\left(\frac{D2}{D1+D2}\tan\theta\right) \text{ and } \theta_2 = \theta - \theta_1.$$

The deflected electron beam 401 passes the back focal point 441 of the objective lens 440 as seen from both the x and y directions. Therefore, the deflection system 400 is capable of achieving vertical incidence at any combination of x and y deflections while minimizing aberrations. Additionally, using two deflector capacitors for one axis provides more flexibility and higher mechanical tolerance compared to using one deflector capacitor for one axis. For example, the back focal point 441 may be changed by slightly adjusting driven ratio (e.g. $\theta_1/\theta_2$) of the two capacitors.

Therefore, the present invention overcomes the conventional geometry limitation of curved electrodes of 120° arcs and simultaneously fulfills minimizing aberration and achieving vertical incidence.

Figure 7:
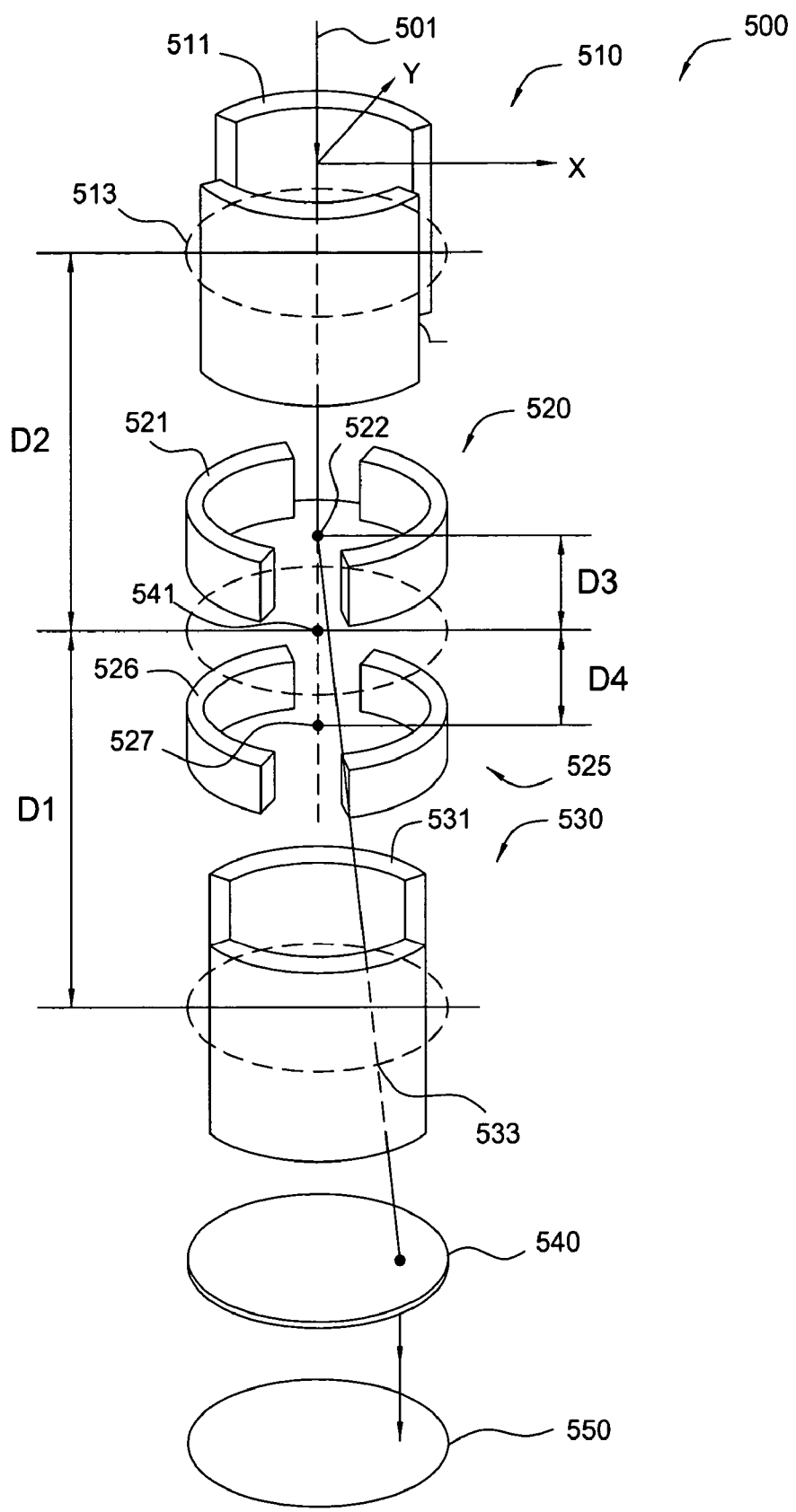
FIG. 7 is a schematic view of a deflection system of the present invention.

FIG. 7 is a schematic view of a deflection system 500 in accordance with another embodiment of the present invention. In the deflection system 500, the simultaneous minimizing aberration and vertical incidence is achieved by using four stages, two deflector capacitors with curved electrodes for each direction x and y. Deflector capacitors 510 and 530 are configured to deflect an electron beam 501 along the y direction, while deflector capacitors 520 and 525 are configured to deflect the electron beam 501 along the x direction. The deflector capacitors 510 and 520 are arranged above an back focal plane 523 of an objective lens 540. The deflector capacitors 525 and 530 are arranged below the back focal plane 523. By adjusting deflection angles from distances D1, D2, D3 and D4, the electron beam 501 may be deflected as if it passes a back focal point 541 of the objective lens 540. In one embodiment, the deflector capacitors 510, 520 and 525, 530 are arranged symmetrically above and below the back focal plane 523.

Four staged deflection systems, such as the deflection system 500, provide more flexibility and higher mechanical tolerance compared to three staged deflection systems. Because both x and y deflectors can be adjusted to match the back focal point of an objective lens.

Further, the exemplary embodiments focus on adjusting two or more deflector capacitors for one axis to a back focal point, or back focal panel of an objective lens. However, two or more deflector capacitors adjusted to a plane slightly different than the back focal plane is also contemplated. For example, two or more deflector capacitors may be adjusted to a plane or a point slightly offset from the back focal plane or back focal point of an objective lens for an advantageous balance of aberrations. Therefore, embodiments of the present invention also contemplates adjusting two or more deflector capacitors near a back focal plane and/or back focal point of an objective lens with a desirable balance of aberrations and angles of incidence.

Figure 8:
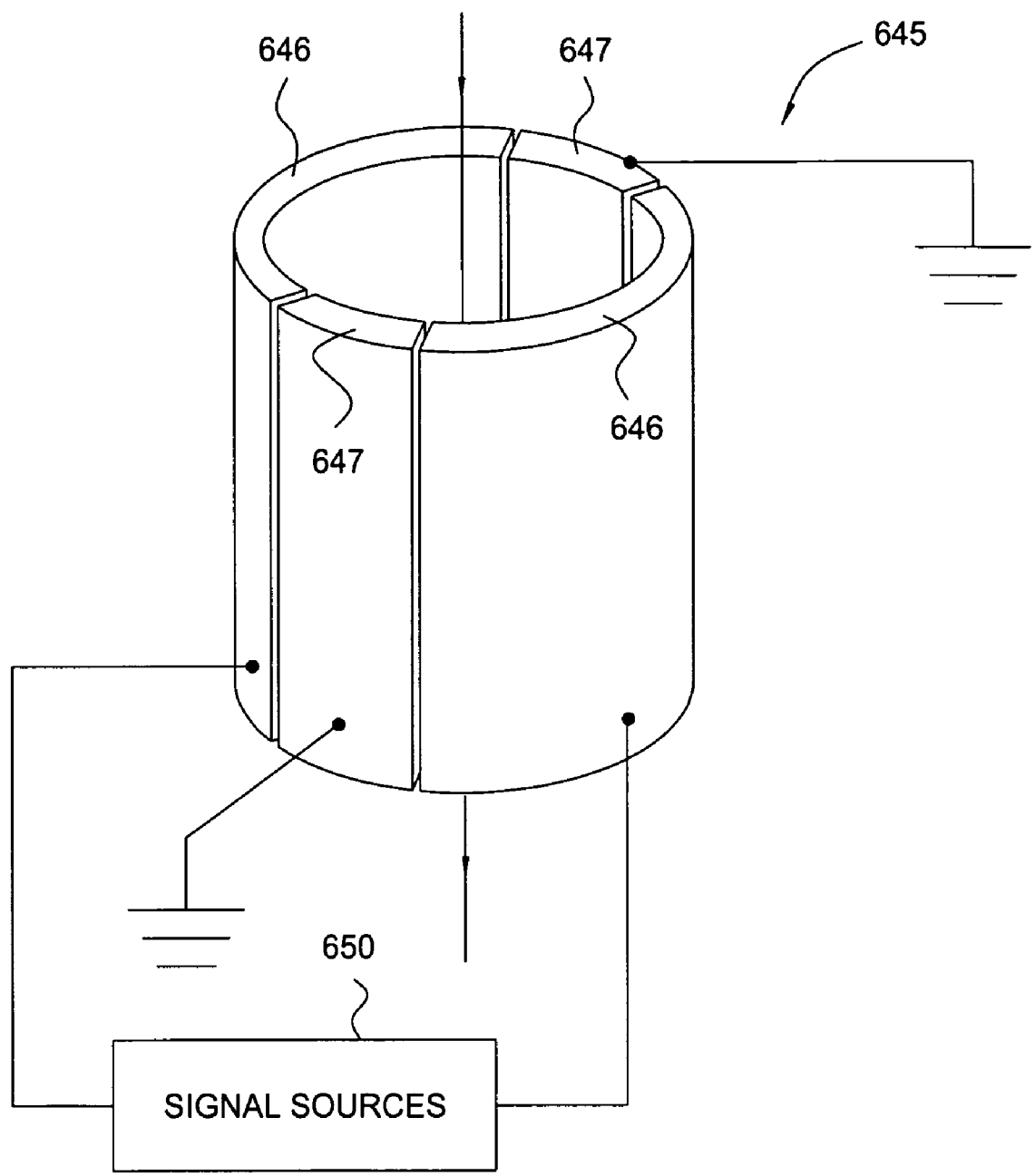
FIG. 8 illustrates a schematic view of a deflector capacitor of the present invention.

FIG. 8 illustrates a schematic view of a deflector capacitor 645 in accordance with one embodiment of the present invention. The deflector capacitor 645 comprises a pair of curved deflector electrodes 646 adapted to be connected to a signal source 650. The connection of signal source 650 and the deflector electrodes 646 is provided in more details in the U.S. patent application filed on Sep. 30, 2005, entitled "Electrostatic Deflection System with Impedance Matching for High Position Accuracy", attorney docket number APPM/010505, which is incorporated by reference. A pair of grounded electrodes 647 is inserted between the deflector electrodes 646 to shield electron beams from external fields. In one embodiment, each of the deflector electrodes 646 covers approximately 120° and each of the grounded electrodes 647 covers approximately 60°.

Additionally, deflector capacitors having deflector electrodes and shield electrodes may be incorporated with deflection systems of the present inventions. For example, any or all of the deflector capacitors 410, 420, 430 of FIG. 4, and 510, 520, 525, 530 of FIG. 7 may be replaced with deflector capacitors with shield, such as the deflector capacitor 645 of FIG. 8.

CONCLUSION

By using multistage deflection for at least one deflection direction, the present invention allows the deflected electron beam passing a back focal plane of an objective lens while not all deflection capacitors are disposed across the back focal plane. As a result, deflection electrodes can have an angle of approximate 120° to minimize aberrations and simultaneously have vertical incidence of the electron beam on a target to avoid distortions or changes in magnification with height variations of the target or focus variations.

While the foregoing is directed to embodiments of the present invention, other and further embodiments of the invention may be devised without departing from the basic scope thereof, and the scope thereof is determined by the claims that follow.

What is claimed is:

1. An apparatus for deflecting an electron beam, comprising:
   first and second deflectors configured to deflect the electron beam along a first direction,
   wherein the first and second deflectors are disposed, respectively, above and below a back focal plane of an objective lens, and the first and second deflectors are configured to deflect the electron beam such a way that their superimposed effects are equivalent to a single deflector positioned symmetrically about the back focal point of the objective lens.

2. The apparatus of 1, further comprising:
   a third deflector disposed approximately symmetrically about the back focal plane, wherein the third deflector is configured to deflect the electron beam along a second direction.

3. The apparatus of 1, further comprising:
third and fourth deflector configured to deflect the electron beam along a second direction,
wherein the third and fourth deflectors are disposed, respectively, above and below a back focal plane of the objective lens.

4. The apparatus of 1, wherein each of the deflector comprises a first pair of opposing electrodes configured to provide a deflection electric field to the electron beam, each electrode of the first pair covers approximately 120° of an arc of a circle.

5. The apparatus of 4, wherein each of the deflector further comprises a second pair of opposing electrodes disposed between the first pair of electrodes and configured to shield the electron beam from outside field, each electrode of the second pair covers approximately 60° of an arc of the circle.

6. The apparatus of 1, wherein the first and second deflectors are disposed symmetrically about the back focal plane.

7. The apparatus of 3, wherein each of the deflector comprises a pair of opposing electrodes, each of the electrodes covers approximately 120° of an arc of a circle.

8. The apparatus of 3, wherein:
the first and second deflectors are disposed symmetrically about the back focal plane; and
the third and fourth deflectors are disposed symmetrically about the back focal plane.

9. An electron beam deflection system comprising:
first and second deflectors configured to deflect an electron beam along a first direction; and
delivery optics configured to deflect the electron beam to a target,
wherein the delivery optics have a back focal plane, the first and second deflectors are disposed on opposite sides of the back focal plane, and the first and second deflectors are configured to have a combined deflection substantially equivalent to a single deflector positioned symmetrically about the back focal point of the objective lens.

10. The electron beam deflection system of 9, wherein each of the deflectors comprises a pair of opposing electrodes, each of the electrodes covers approximately 120° of an arc of a circle.

11. The electron beam deflection system of 9, wherein the first and second deflectors are disposed symmetrically about the back focal plane of the delivery optics.

12. The electron beam deflection system of 9, further comprising:
a third deflector configured to deflect the electron beam along a second direction,
wherein the third deflector is disposed between the first and second deflectors, approximately symmetrically about the back focal plane.

13. The electron beam deflection system of 9, further comprising:
third and fourth deflector configured to deflect the electron beam along a second direction,
wherein the third and fourth deflectors are disposed, respectively, above and below a back focal plane of the delivery optics.

14. A method for deflecting a charged particle beam by a distance, comprising:
providing an objective lens over a target;
providing first and second deflectors configured to deflect the charged particle beam to the objective lens along a first direction, wherein the first deflector is positioned above a back focal plane of the objective lens and the second deflector is positioned below the back focal plane of the objective lens;
determining a first angle and a second angle according to the distance;
deflecting the charged particle beam by the first deflector by the first angle; and
deflecting the charged particle beam by the second deflector by the second angle, wherein the first and second angles are determined such that a back focal point on the back focal plane of the objective lens is approximately on the same straight line of the particle beam after deflected by the first and second deflectors.

15. The method of 14, wherein determining the first angle and the second angle according to the distance comprises determining the first and second angles by locations of the first and second deflectors.

16. The method of 14, further comprising:
providing third and fourth deflectors configured to deflect the charged particle beam to the objective lens along a second direction, wherein the third deflector is positioned above the back focal plane of the objective lens and the fourth deflector is positioned below the back focal plane of the objective lens;
determining a third angle and a fourth angle according to the distance;
deflecting the charged particle beam by the third deflector by a third angle; and
deflecting the charged particle beam by the fourth deflector by a fourth angle.

17. The method of 16, wherein:
determining the first angle and the second angle according to the distance comprises determining the first and second angles by locations of the first and second deflectors; and
determining the third angle and the fourth angle according to the distance comprises determining the third and fourth angles by locations of the third and fourth deflectors.

18. The method of 14, further comprising:
providing a third deflector configured to deflect the charged particle beam to the objective lens along a second direction, wherein the third deflector is positioned approximately symmetrically about the back focal plane of the objective lens; and
deflecting the charge particle beam by the third deflector by a third angle according to the distance.

19. The method of 14, further comprising:
adjusting the first angle and the second angle in response to a change of location of the back focal panel.

* * * * *